United States Patent [19]
Uzawa

[11] Patent Number: 6,144,602
[45] Date of Patent: Nov. 7, 2000

[54] SEMICONDUCTOR MEMORY DEVICE

[75] Inventor: Yuichi Uzawa, Kawasaki, Japan

[73] Assignee: Fujitsu Limited, Kawasaki, Japan

[21] Appl. No.: 09/493,624

[22] Filed: Jan. 28, 2000

[30] Foreign Application Priority Data

Apr. 23, 1999 [JP] Japan .................................. 11-116521

[51] Int. Cl.$^7$ ..................................................... G11C 7/00
[52] U.S. Cl. ....................... 365/203; 365/205; 365/230.03
[58] Field of Search ................................... 365/203, 205, 365/230.03

[56] References Cited

U.S. PATENT DOCUMENTS 5,625,592  4/1997  Shinozaki ............................. 365/203 X
5,907,515  5/1999  Hatakeyama ...................... 365/230.03

Primary Examiner—Huan Hoang
Attorney, Agent, or Firm—Arent Fox Kintner Plotkin & Kahn, PLLC

[57] ABSTRACT

As the pre-charge potential for write global data buses (12, 13), a potential lower than the power supply voltage (Vii) for peripheral circuit by the threshold voltage (Vth) of a transistor is used. This suppresses disturbance in the potential of a pair of bit lines (18, 19) due to pre-charge operation. It suffices if the write global data buses are pre-charged to the potential lower than the power supply voltage (Vii) for peripheral circuit by the threshold voltage (Vth). This can reduce current consumption accordingly. By generating the pre-charge potential without using the power supply voltage (Viic) for core, adverse effects on sense operation can be avoided.

7 Claims, 7 Drawing Sheets

ARRANGEMENT OF PART OF SEMICONDUCTOR STORAGE DEVICE

POTENTIALS OF WRITE GLOBAL DATA BUS
AND PAIR OF BIT LINES

POTENTIALS OF WRITE GLOBAL DATA BUS
AND PAIR OF BIT LINES

CASE WHEREIN Viic IS USED AS PRECHARGE POTENTIAL FOR WRITE GLOBAL DATA BUSES

ARRANGEMENT OF PART OF SEMICONDUCTOR STORAGE DEVICE OF THIS EMBODIMENT

ARRANGEMENT OF AMPLIFYING SECTION OF THIS EMBODIMENT

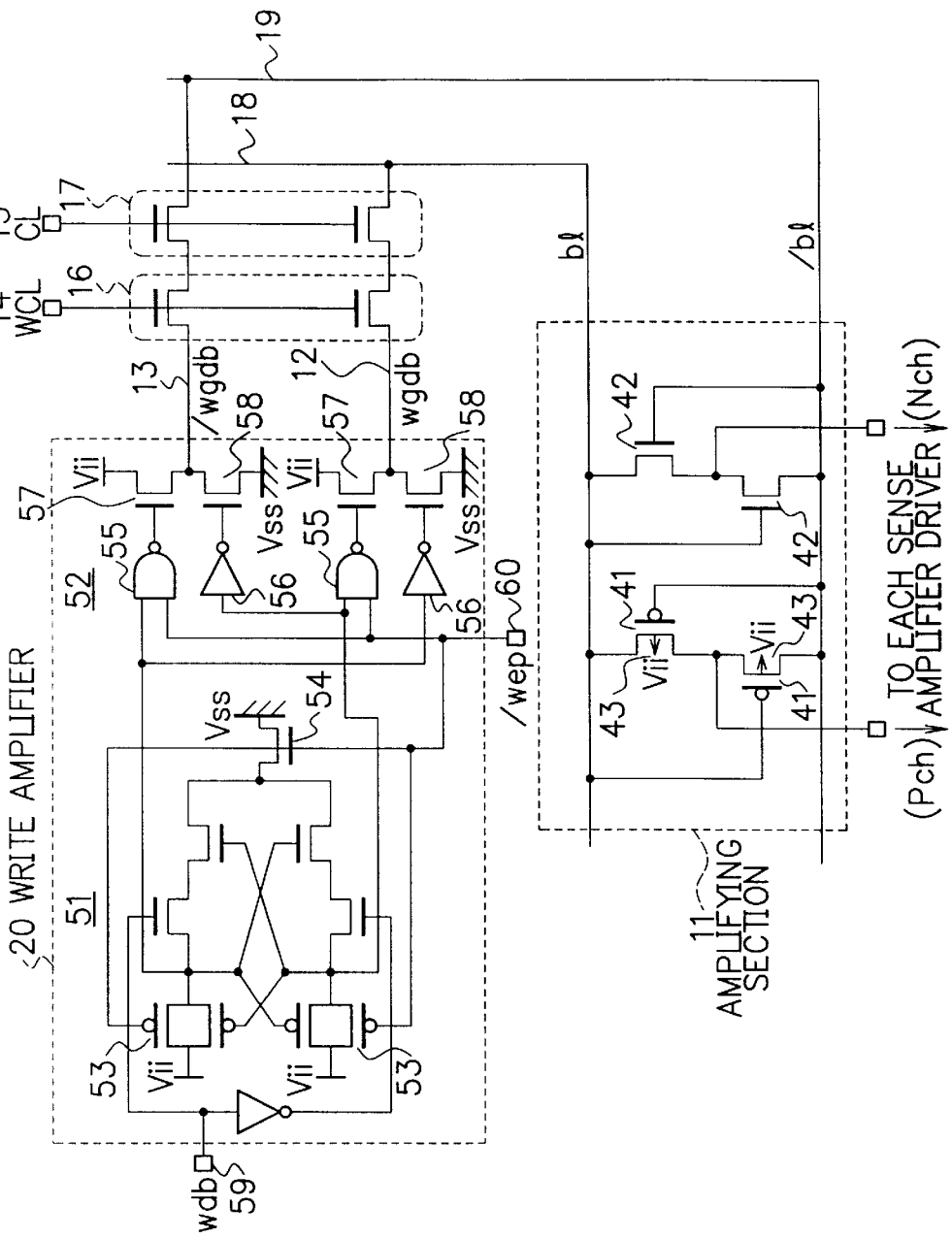
FIG. 7 DETAILED ARRANGEMENT OF PART OF SEMICONDUCTOR STORAGE DEVICE OF THIS EMBODIMENT

SEMICONDUCTOR MEMORY DEVICE

BACKGROUND OF THE INVENTION

1. Field of the Invention

The present invention relates to a semiconductor memory device suitably used for, e.g., a memory such as a DRAM.

2. Description of the Related Art

Recently, a semiconductor memory device such as a memory represented by a DRAM or the like, has been required to operate at high speed with low power consumption. In order to attain a reduction of the power consumption in a semiconductor memory device, the power consumption in data write operation should be reduced, for example.

FIG. 1 shows the construction of part of a DRAM. The DRAM is provided with many memory cell arrays on a chip in the form of a matrix. Sense amplifiers are provided for each memory cell array. FIG. 1 representatively shows several sense amplifiers and the corresponding write amplifiers. As shown in FIG. 1, each sense amplifier 10 is connected to the corresponding write amplifier 20 through complementary write global data buses (wgdb, /wgdb) 12 and 13 (the symbol "/" indicates inverted signal).

The sense amplifier 10 has an amplifying section 11 connected to a pair of complementary bit lines (b1, /b1) 18 and 19, a column selection transistor 17 for selecting a column line (CL) 15 in accordance with an address, and a write column selection transistor 16 for selecting a write column line (Write CL) 14 in accordance with an address. The write column line 14 and the column line 15 are commonly connected to the respective gates of the transistors 16 and 17 in sense amplifiers 10 disposed in a column direction.

In this construction, when data is to be written in a memory cell (not shown), "H"-level data is supplied to the gates of the write column selection transistor 16 and the column selection transistor 17 on the basis of an address signal to turn both the transistors 16 and 17 on. The data to be written, which has been amplified by the write amplifier 20, is input to the sense amplifier 10 through the write global data buses 12 and 13, and transferred onto the pair of bit lines 18 and 19 through the respective transistors 16 and 17. The data is then written in the memory cell at the intersection of the pair of bit lines 18 and 19 and the word line (not shown) selected on the basis of the address signal.

As the potential of the "H"-level data output to the pair of bit lines 18 and 19, a power supply voltage Viic for core (for sense amplifier) is used. As the potential for turning the write column selection transistor 16 and the column selection transistor 17 on, and the pre-charge potential for the write global data buses 12 and 13, a power supply voltage Vii for peripheral circuit is used, which is sufficiently higher than the power supply voltage Viic for core.

In the above construction, as a method for reducing the current consumption in a write operation, it is thinkable to set the pre-charge potential for the write global data buses (wgdb, /wgdb) 12 and 13 to half the power supply voltage Vii for peripheral circuit.

In this method, when the write global data buses 12 and 13 are to be restored to the pre-charge state after a write operation, the write global data buses 12 and 13 should be simply short-circuited to make the respective potentials cancel out. The write global data buses 12 and 13 are thereby automatically pre-charged to the ½ Vii level. The main power used in this case is only the power for raising the pre-charge potential (½ Vii) to the driving potential Vii for write operation when the pre-charge state shifts to a write operation.

But, when a write amplifier 20 is made to perform a data mask operation, i.e., a write amplifier 20 in a row on which data write is inhibited, is inactivated, the following problem arises. The gates of the write column selection transistors 16 and the gates of the column selection transistors 17 in the sense amplifiers 10 disposed in a column direction, are commonly connected through a write column line 14 and a column line 15 in a pair, respectively. For this reason, when an "H"-level signal is supplied to the gates, the transistors 16 and 17 in any of the sense amplifiers 10 become ON.

Consequently, there may be a case that the write column selection transistor 16 and the column selection transistor 17 in a sense amplifier 10 are ON but the corresponding write amplifier 20 is inactivated. In such a case, if the write global data buses 12 and 13 are pre-charged, the potentials 21 and 22 initially generated on the pair of bit lines 18 and 19 on the basis of the power supply voltage Viic for core are influenced by the inactivated write amplifier 20. As a result, both the potentials are attracted to the pre-charge potential 23 of the pair of bit lines and vary, as shown in FIG. 2. If this influence is great, the respective potentials 21 and 22 may be reversed to invert the data values.

For this reason, conventionally, the pre-charge potential for the write global data buses (wgdb, /wgdb) 12 and 13 is set to the power supply voltage Vii for peripheral circuit in order to reduce the influence of disturbance on the potentials of the pair of bit lines 18 and 19, as shown in FIG. 3. In this setting, disturbance appears only in one of the potentials 31 and 32 of the pair of bit lines 18 and 19, and the data values are prevented from being inverted. In this case, however, current consumption increases because the write global data buses 12 and must be pre-charged to the power supply voltage Vii for peripheral circuit, which is a high potential.

As a method for reducing disturbance in the potentials of the pair of bit lines 18 and 19, and also current consumption, it is thinkable to use the power supply voltage Viic for core, which is a power used in the DRAM other than the power supply voltage Vii for peripheral circuit, as the pre-charge potential for the write global data buses 12 and 13, as shown in FIG. 4. This power supply voltage Viic for core is sufficiently lower than the power supply voltage Vii for peripheral circuit and higher than ½ Vii.

In this setting, the disturbance in the potentials of the pair of bit lines 18 and 19 can be reduced because a voltage higher than ½ Vii is used as the pre-charge potential for the write global data buses 12 and 13. Besides, since it suffices if the write global data buses 12 and 13 are pre-charged to the power supply voltage Viic for core sufficiently lower than the power supply voltage Vii for peripheral circuit, current consumption can be reduced accordingly.

But, when the power supply voltage Viic for core is used as the pre-charge potential, the potential level of the power supply voltage Viic for core, which is less in surplus power than the power supply voltage Vii for peripheral circuit, may vary due to a pre-charge operation. This may impose adverse effects such as noise on a sense operation of the sense amplifier 10 sharing the same power supply. On the other hand, if the power supply voltage Viic for core is increased to take a countermeasure against the noise, the chip size increases.

SUMMARY OF THE INVENTION

It is an object of the present invention to provide a semiconductor memory device with a simple construction, which can suppress disturbance in the potentials of a pair of bit lines, noise in sense operation of a sense amplifier, and the like, and reduce current consumption in data write operation.

In a semiconductor memory device according to the present invention, a potential higher than a power supply voltage for core and lower than a power supply voltage for peripheral circuit is used as a precharge potential for write global data buses. This makes it possible to suppress disturbance in the potentials of a pair of bit lines connected to a sense amplifier. Besides, it suffices if the write global data buses are pre-charged to a voltage lower than the power supply voltage for peripheral circuit. This allows pre-charge operation with smaller current consumption than in a case wherein the pre-charge potential is raised to the power supply voltage for peripheral circuit.

In the present invention, a potential lower than the power supply voltage for peripheral circuit by the threshold voltage of a transistor is used as the pre-charge potential for the write global data buses. This makes it possible to generate the pre-charge potential from the power supply voltage for peripheral circuit with surplus power without using the power supply voltage for core with less surplus power, which is used for sense amplifiers. Therefore, adverse effects on sense operation can be avoided. Besides, since such a pre-charge potential can be generated by using the initially existing power supply voltage for peripheral circuit and one transistor, there is no need to increase the power supply voltage for sense amplifier or prepare a new power supply voltage. This makes it possible to reduce current consumption without increasing the circuit area.

According to another aspect of the present invention, a potential higher than the pre-charge potential for the write global data buses is used as the potential of the back gate of a transistor constituting an amplifying section of a sense amplifier. This prevents the potential of the back gate from becoming lower than the potentials appearing on a pair of bit lines connected to the sense amplifier in pre-charge operation for the write global data buses, and hence can prevent any current from flowing into the semiconductor substrate through the back gate.

BRIEF DESCRIPTION OF THE DRAWINGS

FIG. 7 is a circuit diagram showing an example of detailed circuit construction of the semiconductor memory device according to the embodiment.

DETAILED DESCRIPTION OF THE PREFERRED EMBODIMENTS

Hereinafter, an embodiment of the present invention will be described with reference to drawings.

Figure 1:
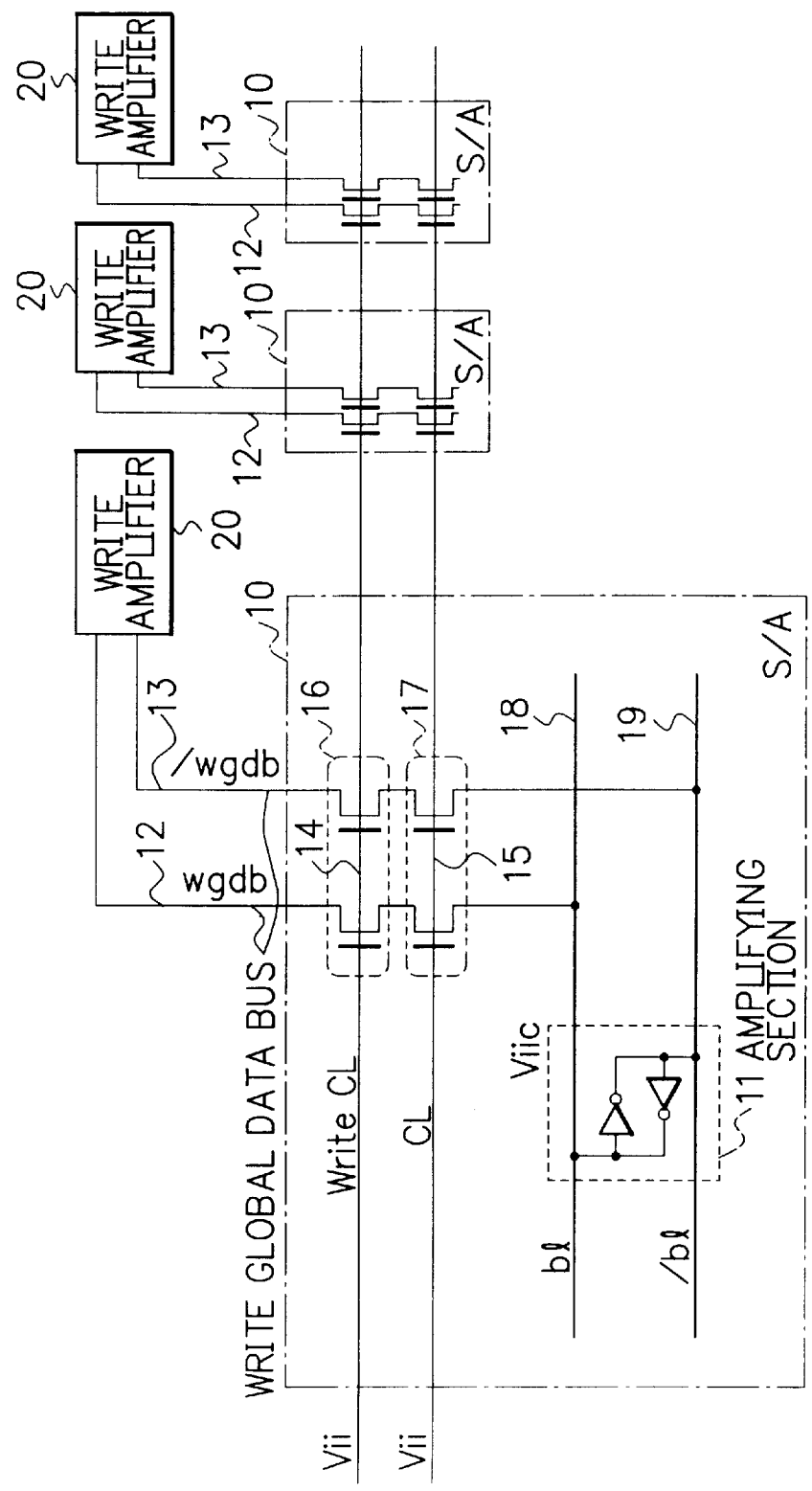
FIG. 1 is a circuit diagram showing the construction of part of a DRAM.
Figure 2:
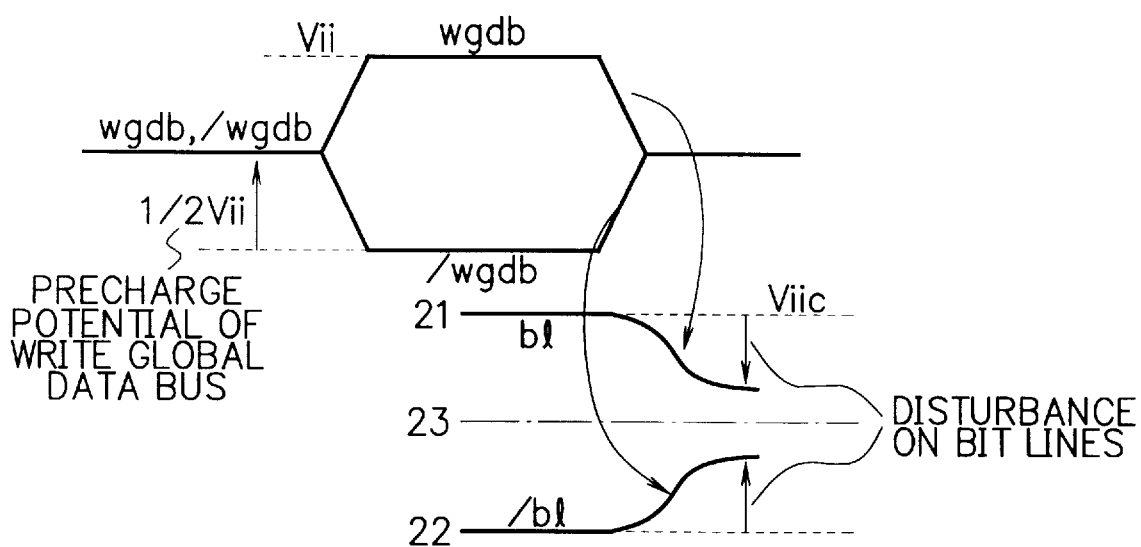
FIG. 2 is a chart showing an example of how the potentials of a write global data bus and a pair of bit lines change.
Figure 3:
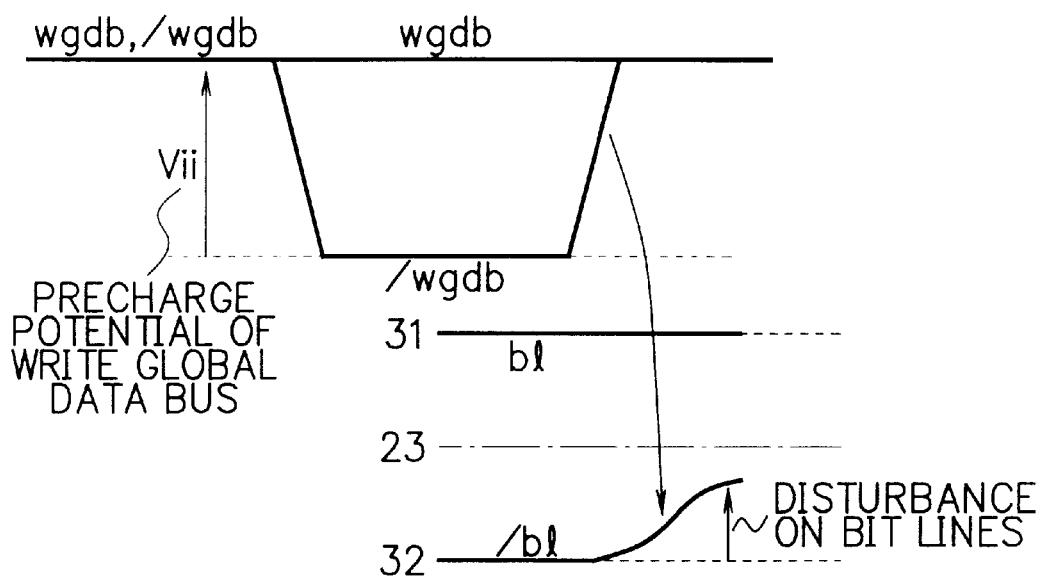
FIG. 3 is a chart showing another example of how the potentials of the write global data bus and the pair of bit lines change.
Figure 4:
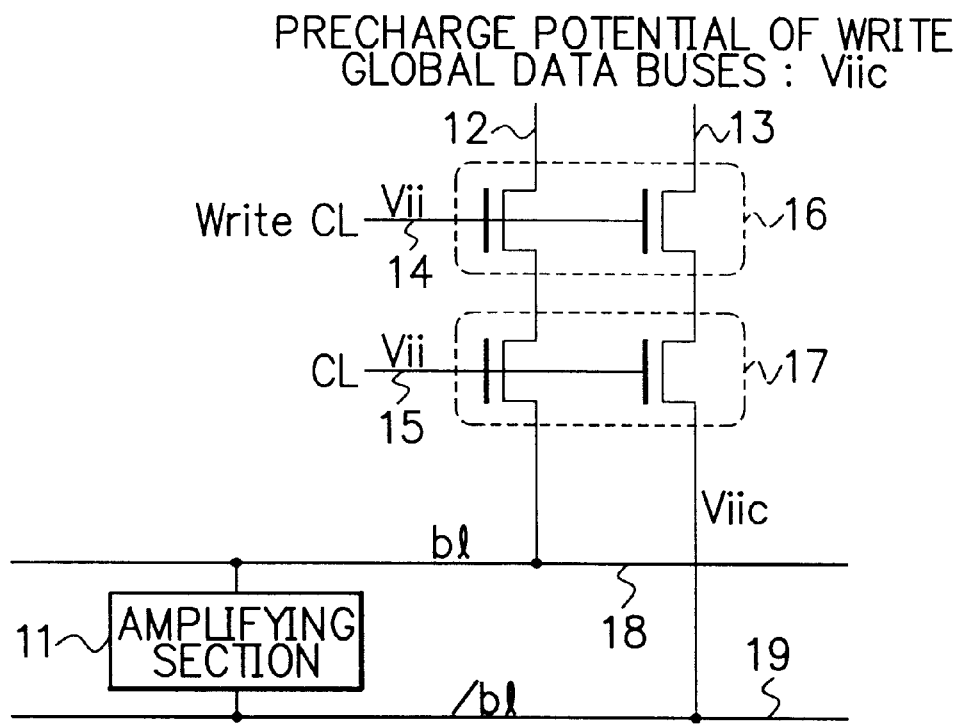
FIG. 4 is a circuit diagram showing a conventional device using the power supply voltage for core as the pre-charge potential for write global data buses.
Figure 5:
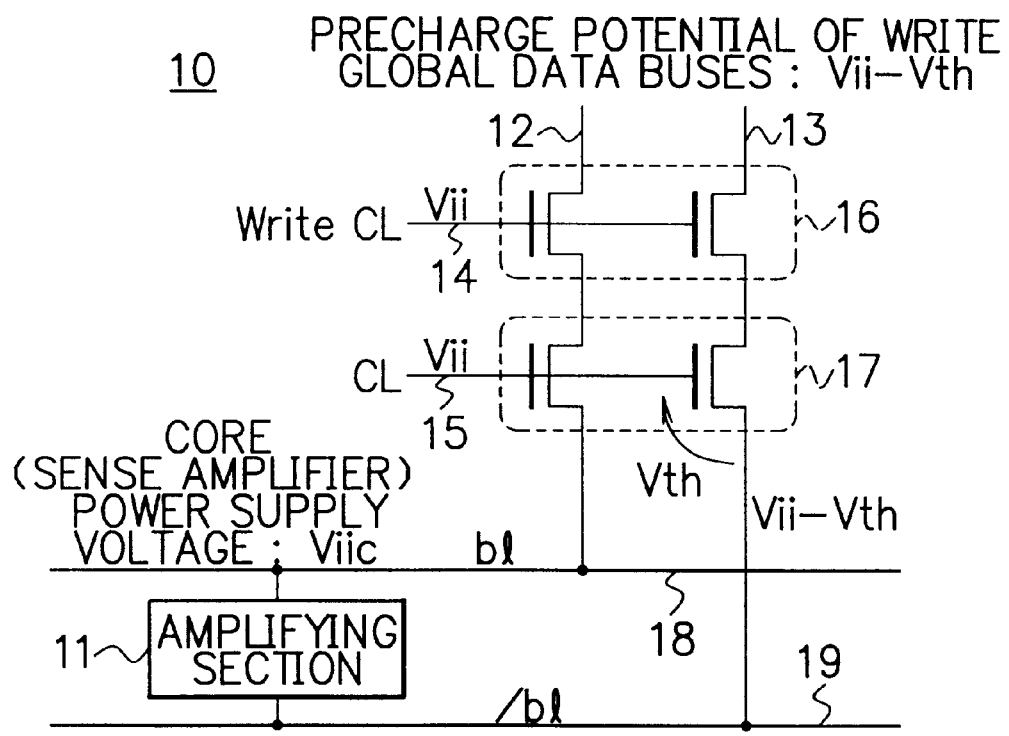
FIG. 5 is a circuit diagram showing an example of the construction of a sense amplifier as part of a semiconductor memory device according to an embodiment of the present invention.

FIG. 5 shows the construction of a sense amplifier 10 as part of a semiconductor memory device according to this embodiment, wherein the same reference numerals as in FIG. 1 denote the same parts as in FIG. 1. As shown in FIG. 5, in this embodiment, as the pre-charge potential for the write global data buses 12 and 13, used is a voltage (Vii–Vth) lower than the power supply voltage Vii for peripheral circuit by the threshold voltage Vth of a transistor.

Referring to FIG. 5, when both the write column selection transistor 16 and the column selection transistor 17 are turned on, since the potentials of the write column line 14 and the column line 15 respectively connected to the gates of the transistors 16 and 17 are set at Vii, the potential (Vii–Vth) appears at the pair of bit lines 18 and 19. This is similar to the conventional case that the power supply voltage Vii for peripheral circuit is used as the pre-charge potential for the write global data buses 12 and 13.

That is, even if the pre-charge potential for the write global data buses 12 and 13 is lowered from Vii in the conventional case to (Vii–Vth) in this embodiment, the same potential (Vii–Vth) appears at the pair of bit lines 18 and 19. For this reason, even if the pre-charge potential is set to (Vii–Vth), the pre-charge rate of the write global data buses 12 and 13 does not decrease.

In this embodiment, in consideration of this fact, the pre-charge potential for the write global data buses 12 and 13 is set to a potential lower than the power supply voltage Vii for peripheral circuit by the threshold voltage Vth of a transistor (the potential difference between the source or drain and the gate). In this setting, it is enough if the data buses are pre-charged to the voltage lower than the power supply voltage Vii for peripheral circuit by the threshold voltage Vth of the transistor, so current consumption can be reduced accordingly. Besides, if the threshold voltage Vth is set such that the pre-charge potential (Vii–Vth) is lower than at least the power supply voltage Viic for core, disturbance in the potential of the pair of bit lines 18 and 19 can be suppressed.

The pre-charge potential (Vii–Vth) in this embodiment can be generated from the power supply voltage Vii for peripheral circuit by using one transistor. Furthermore, the power supply voltage Vii for peripheral circuit is a surplus power supply voltage initially existing as the supply power for peripheral circuit. There is no need to amplify a power supply voltage for sense amplifier or prepare a new power supply voltage, unlike the case of using the power supply voltage Viic for core. The above reduction of current consumption can therefore be attained without increasing the circuit area. Further in this embodiment, since the power supply voltage Viic for sense amplifiers 10 is not used as the pre-charge potential for the write global data buses 12 and 13, adverse effects on sense operation can be avoided.

Figure 6:
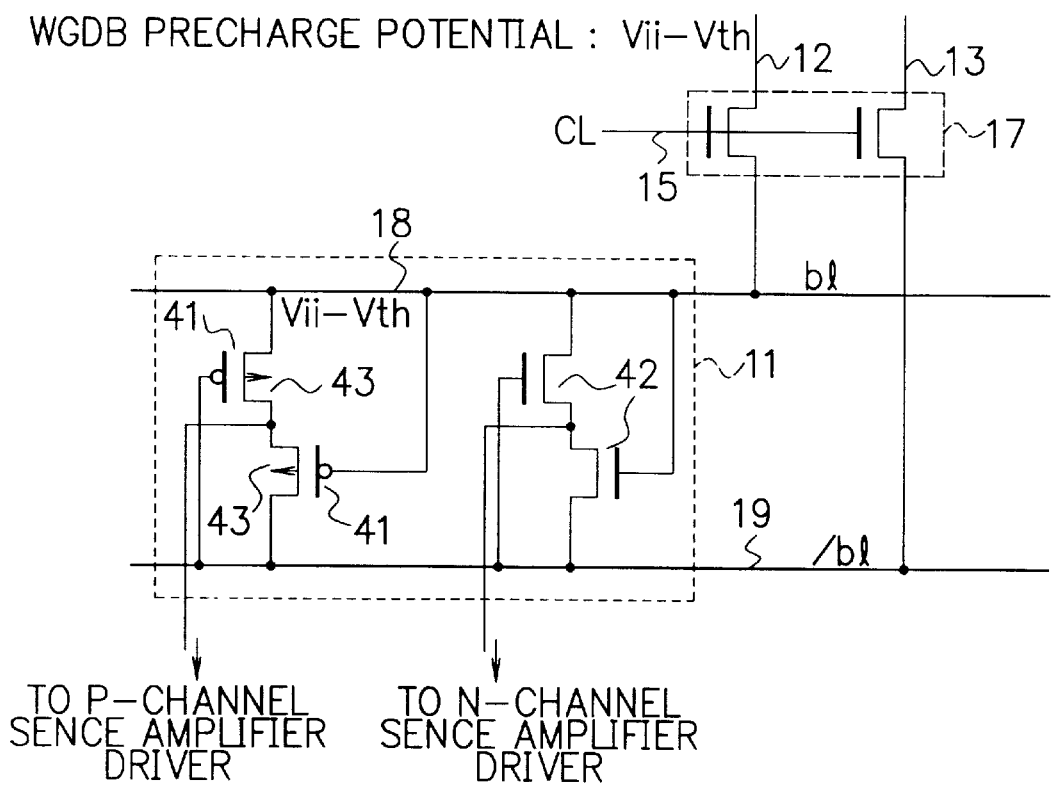
FIG. 6 is a circuit diagram showing a detailed construction of the amplifying section shown in FIG. 5.

FIG. 6 shows a detailed construction of the amplifying section 11 shown in FIG. 5. As shown in FIG. 6, the amplifying section 11 has a flip-flop construction comprising an inverter made up of two P-channel transistors 41 and an inverter made up of two N-channel transistors 42. The back gates 43 of the P-channel transistors 41 are connected to the semiconductor substrate (well).

In this construction, when the voltage at the back gates 43 of the P-channel transistors 41 is set to the power supply voltage Viic for core, the potential of the pair of bit lines 18 and 19 become (Vii–Vth) in pre-charge operation for the write global data buses 12 and 13. That is, the potential at the back gates 43 becomes lower than the precharge potential. In this case, since the p-n junctions of the P-channel transistors 41 are forward-biased, a current may flow into the semiconductor substrate.

In this embodiment, therefore, the potential at the back gates 43 of the P-channel transistors 41 is set to the power supply voltage Vii for peripheral circuit that is higher than the potential (Vii–Vth) appearing at the pair of bit lines 18 and 19 in pre-charge operation for the write global data buses 12 and 13. In this setting, the p-n junctions of the P-channel transistors 41 are not forward-biased. This prevents any current from flowing into the substrate.

FIG. 7 shows an example of the practical circuit construction to implement the contents of this embodiment described above. In FIG. 7, the same reference numerals as in FIGS. 5 and 6 denote the same parts as in FIGS. 5 and 6. FIG. 7 shows a detailed construction of a write amplifier 20, in particular.

As shown in FIG. 7, the write amplifier 20 has an amplifying section 51 made up of P-channel transistors and N-channel transistors, and a switch section 52 for switching data, which has passed through the amplifying section 51, in accordance with pre-charge operation and write operation. A terminal 59 is for inputting external data wdb to the write amplifier 20 through a write data bus (not shown). Another terminal 60 is for inputting a pre-charge control signal /wep.

The amplifying section 51 has a P-channel transistor 53 and an N-channel transistor 54 which are turned on/off in accordance with the pre-charge control signal /wep. In write operation, the pre-charge control signal /wep is set at "H" to turn the P-channel transistor 53 off and the N-channel transistor 54 on. The amplifying section 51 then amplifies the external data wdb input through the terminal 59 and supplies the resultant data to the switch section 52.

In pre-charge operation, the pre-charge control signal /wep is set at "L" to turn the P-channel transistor 53 on and the N-channel transistor 54 off. So, the external data wdb is not amplified, and "H" data at the level of the power supply voltage Vii for peripheral circuit is forcibly sent to the switch section 52.

For complementary two write global data buses 12 and 13, the switch section 52 has two sets of constructions each comprising a NAND gate 55, an inverter 56, and two N-channel transistors 57 and 58 whose gates receive outputs from the NAND gate 55 and the inverter 56.

In this embodiment, the source or drain of the N-channel transistor 57 is connected to the write global data buses 12 and 13. In this case, the threshold voltage Vth between the gate and the source or drain of the N-channel transistor 57 is preferably set to be equal to the threshold Vth' of the column selection transistor 17. But, these threshold voltages need not always be equal.

For example, if the pre-charge potential (Vii–Vth) for the write global data buses 12 and 13 satisfies Viic<(Vii–Vth) <Vii, the threshold voltage Vth of the N-channel transistor 57 need not always be equal to the threshold voltage Vth' of the column selection transistor 17. But, even in this case, Vth>Vth' is preferable.

Data supplied from the amplifying section 51 is input to one input terminal of the corresponding NAND gate 55 and to the gate of the corresponding N-channel transistor 58 through the corresponding inverter 56. The pre-charge control signal /wep is input to the other input terminal of the corresponding NAND gate 55. In this operation, when the pre-charge control signal /wep is set at "L" to pre-charge the write global data buses 12 and 13, the output of each NAND gate 55 is always set at "H" (the level of the power supply voltage Vii for peripheral circuit).

Since the source or drain of each N-channel transistor 57, which receives the output of the corresponding NAND gate 55 through its gate, is connected to the corresponding one of the write global data bus 12 and 13, the write global data buses 12 and 13 are pre-charged to the potential (Vii–Vth) lower than the power supply voltage Vii for peripheral circuit by the threshold voltage Vth of the N-channel transistors 57.

When the gates of the write column selection transistor 16 and the column selection transistor 17 are set at "H", i.e., the level of the power supply voltage Vii for peripheral circuit, the transistors 16 and 17 are turned on. But, the potential (Vii–Vth) appears intact at the pair of bit line 18 and 19.

Besides, in the amplifying section 11 in the sense amplifier 10, the potential of the back gate 43 of each P-channel transistor 41 is set to the power supply voltage Vii for peripheral circuit higher than the pre-charge potential (Vii–Vth). like in FIG. 6. For this reason, even if the potential of the pair of bit lines 18 and 19 becomes (Vii–Vth) at the time of pre-charging the write global data buses 12 and 13, the p-n junction of each P-channel transistor 41 is not forward-biased, so any current is prevented from flowing into the substrate.

The above embodiment is merely a practical example of the implementation of the present invention. It should therefore be understood that the scope of the present invention is not limited to the embodiment. Various changes and modifications can be made without departing from the spirit and scope of the present invention.

For example, in the above embodiment, the voltage lower than the power supply voltage Vii for peripheral circuit by the threshold voltage Vth of the transistor, is set as the pre-charge potential. But, a pre-charge potential need not be generated by using the threshold voltage Vth of the transistor as long as a voltage V that satisfies Viic<V<Vii can be obtained. Besides, the pre-charge potential need not always be generated from the power supply voltage Vii for peripheral circuit. For example, an external power supply voltage for the semiconductor memory device or the voltage boosted by a boosting circuit ordinarily incorporated in the semiconductor memory device, may be used.

In the above embodiment, the power supply voltage Vii for peripheral circuit is used as the potential of the back gate 43 of each P-channel transistor 41 in the sense amplifier 10. But, the voltage to be used need not always be the power supply voltage Vii for peripheral circuit as long as the voltage is higher than (Vii–Vth). But, since the power supply voltage Vii for peripheral circuit is a power supply voltage initially existing as the power supply voltage for peripheral circuit, the use of this voltage eliminates the necessity to generate a voltage higher than (Vii–Vth). This simplifies the circuit construction.

What is claimed is:

1. A semiconductor memory device having a core portion including a sense amplifier, and a peripheral circuit including a write amplifier, said sense amplifier and said write amplifier connected to each other via a global data bus,
   wherein a potential higher than a power supply voltage for said core portion and lower than a power supply voltage for said peripheral circuit is applied as a pre-charge potential for write global data bus.

2. A device according to claim 1, wherein a potential lower than said power supply voltage for peripheral circuit by the threshold voltage of a transistor is used as said pre-charge potential for said write global data buses.

3. A device according to claim 1, wherein a potential higher than said pre-charge potential for said write global data buses is used as the potential at the back gate of a transistor constituting an amplifying section of said sense amplifier.

4. A device according to claim 2, wherein a potential higher than said pre-charge potential for said write global data buses is used as the potential at the back gate of a transistor constituting an amplifying section of said sense amplifier.

5. A device according to claim 3, wherein said power supply voltage for peripheral circuit is used as said potential at the back gate of said transistor constituting said amplifying section of said sense amplifier.

6. A device according to claim 4, wherein said power supply voltage for peripheral circuit is used as said potential at the back gate of said transistor constituting said amplifying section of said sense amplifier.

7. A semiconductor memory device having a core portion including a sense amplifier, and a peripheral circuit including a write amplifier, said sense amplifier and said write amplifier connected to each other via a global data bus, wherein said write amplifier includes a transistor for outputting a potential lower than a power supply voltage for said peripheral circuit by the threshold voltage of said transistor to write global data bus when said write global data bus is pre-charged.

* * * * *